(12) United States Patent
Franz et al.

(10) Patent No.: US 10,672,683 B2
(45) Date of Patent: Jun. 2, 2020

(54) HEAT TRANSFER ADAPTER PLATE

(71) Applicant: HEWLETT PACKARD ENTERPRISE DEVELOPMENT LP, Houston, TX (US)

(72) Inventors: John P. Franz, Houston, TX (US); Charles R. Hanna, Houston, TX (US); Brian T. Purcell, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 5 days.

(21) Appl. No.: 15/774,293

(22) PCT Filed: Jan. 28, 2016

(86) PCT No.: PCT/US2016/015280
§ 371 (c)(1),
(2) Date: May 8, 2018

(87) PCT Pub. No.: WO2017/131688
PCT Pub. Date: Aug. 3, 2017

(65) Prior Publication Data
US 2019/0074239 A1    Mar. 7, 2019

(51) Int. Cl.
*H01L 23/40* (2006.01)
*H05K 1/02* (2006.01)
(Continued)

(52) U.S. Cl.
CPC ...... *H01L 23/4093* (2013.01); *H01L 23/4006* (2013.01); *H01L 23/36* (2013.01);
(Continued)

(58) Field of Classification Search
CPC ............ H01L 23/4093; H01L 23/4006; H01L 23/427; H01L 23/3675; H01L 2023/4043;
(Continued)

(56) References Cited

U.S. PATENT DOCUMENTS 5,370,178 A * 12/1994 Agonafer .............. H01L 23/467
165/137
5,482,113 A *  1/1996 Agonafer ................ F28D 1/024
165/122

(Continued)

FOREIGN PATENT DOCUMENTS

JP    2003188321 A    7/2003

OTHER PUBLICATIONS

International Search Report and Written Opinion, International Application No. PCT/US2016/015280, dated Oct. 27, 2016, pp. 1-10, KIPO.

(Continued)

*Primary Examiner* — Zachary Pape
(74) *Attorney, Agent, or Firm* — Brooks, Cameron & Huebsch, PLLC

(57) ABSTRACT

Example implementations relate to a heat transfer adapter plate. For example, a heat transfer adapter plate can comprise a first retention mechanism to couple a heat transfer device to the heat transfer adapter plate and a second retention mechanism to couple the heat transfer adapter plate to an electronic component. The heat transfer adapter plate can accept a plurality of heat transfer device types, including but not limited to, a passive heat exchanger, an active heat exchanger, and a heat pipe.

10 Claims, 3 Drawing Sheets

(51) Int. Cl.
*H05K 7/20* (2006.01)
*H01L 23/427* (2006.01)
*H01L 23/36* (2006.01)

(52) U.S. Cl.
CPC .......... *H01L 23/427* (2013.01); *H05K 1/0203* (2013.01); *H05K 7/2049* (2013.01); *H05K 7/20409* (2013.01); *H05K 7/20454* (2013.01)

(58) Field of Classification Search
CPC ....... H01L 2023/405; H01L 2023/4062; H01L 2023/4081; H01L 2023/4087; H01L 23/40–4006; H01L 2023/4056; H05K 2201/066; H05K 7/2039–20518; H05K 1/0201–0203
See application file for complete search history.

(56) References Cited

U.S. PATENT DOCUMENTS

| | | | |
|---|---|---|---|
| 6,305,463 | B1 | 10/2001 | Salmonson |
| 6,625,021 | B1 * | 9/2003 | Lofland ............... H01L 23/4093 165/104.33 |
| 7,164,583 | B2 * | 1/2007 | Lee ..................... H01L 23/4093 165/80.3 |
| 7,492,598 | B2 * | 2/2009 | Narasimhan ........ H01L 23/4006 165/185 |
| 7,697,296 | B2 * | 4/2010 | Floyd .................. H01L 23/4093 165/80.3 |
| 8,542,488 | B2 * | 9/2013 | Peterson ................... G06F 1/20 361/679.47 |
| 2002/0008963 | A1 * | 1/2002 | DiBene, II ................ G06F 1/18 361/720 |
| 2005/0077618 | A1 | 4/2005 | McCutcheon et al. |
| 2005/0122683 | A1 | 6/2005 | Tung |
| 2006/0139886 | A1 * | 6/2006 | Barsun ................ H01L 23/4006 361/704 |
| 2008/0151507 | A1 | 6/2008 | Wu et al. |
| 2009/0040731 | A1 | 2/2009 | Jin et al. |
| 2009/0059533 | A1 * | 3/2009 | Li ........................ H01L 23/4093 361/709 |
| 2009/0279263 | A1 * | 11/2009 | Kuo .................... H01L 23/4093 361/709 |
| 2011/0149516 | A1 * | 6/2011 | Yang ......................... G06F 1/20 361/697 |
| 2013/0279117 | A1 * | 10/2013 | Chen .................... H05K 7/2039 361/704 |
| 2013/0342997 | A1 * | 12/2013 | Yeh ..................... H01L 23/4093 361/704 |
| 2014/0116670 | A1 | 5/2014 | Kwak et al. |
| 2014/0262449 | A1 * | 9/2014 | Gektin ................ H01L 23/4006 174/252 |
| 2015/0062825 | A1 * | 3/2015 | Ossimitz ............. H01L 21/4882 361/719 |

OTHER PUBLICATIONS

Silicon Graphics International Corp., "SGI ICE X: Ultimate Flexibility for the World's Fastest Supercomputer," White Paper, 2013, pp. 1-15.

* cited by examiner

HEAT TRANSFER ADAPTER PLATE

BACKGROUND

Electronic devices can have temperature limitations. For example, an electronic device can malfunction if the temperature of the electronic device reaches or exceeds a threshold temperature. Heat from the use of the electronic devices can be controlled using cooling systems. Example cooling systems include an air cooling system and a liquid cooling system.

DETAILED DESCRIPTION

Electronic systems can be designed to balance conflicts between power density, spatial layout, temperature requirements, acoustic noise, and other factors. Cooling systems can use a heat transfer device to remove heat from the system. Air cooling systems can use passive heat exchangers, such as air-cooled heat sinks, and fans to remove heat from the system. Liquid cooling systems can use active heat exchangers, such as liquid-cooled heat sinks or liquid-cooled cold plate heat sinks, and fluids to remove heat from the system. However, various heat transfer device types may be mutually exclusive. For example, a liquid-cooled heat sink may not be compatible with an air cooling system.

A heat transfer adapter plate can provide an option of using either an air cooling system or a liquid cooling system with an electronic component. In previous systems an electronic component can be designed for use with either an air cooling system or a liquid cooling system. For example, if an electronic component has an air cooling system, to replace the air cooling system with a liquid cooling system, an air-cooled heat sink can be removed from the electronic component and a liquid-cooled heat sink can be installed. Changing a heat sink on an electronic component can increase the risk of damage to the electronic components and can add extra cost from wasting materials and labor.

The heat transfer adapter plate can receive a variety of heat transfer device types. The heat transfer device types can include, but are not limited to, a passive heat exchanger such as an air-cooled heat sink, an active heat exchanger such as a liquid-cooled heat sink, and a heat pipe such as a vapor chamber. The use of a heat pipe can be beneficial in a situation where an electronic component has a limited amount of clearance surrounding the electronic component because generated heat can be transferred to a distant cooling system. Although the heat transfer adapter plate may add a layer of thermal resistance, it can be advantageous to have the capacity to use a variety of heat transfer devices without multiple versions of a single electronic component designed for each heat transfer device type. The heat transfer adapter plate can be in proximity to a heat generating element on an electronic component, such as an application specific integrated circuit (ASIC) on a printed circuit board (PCB).

Figure 1:
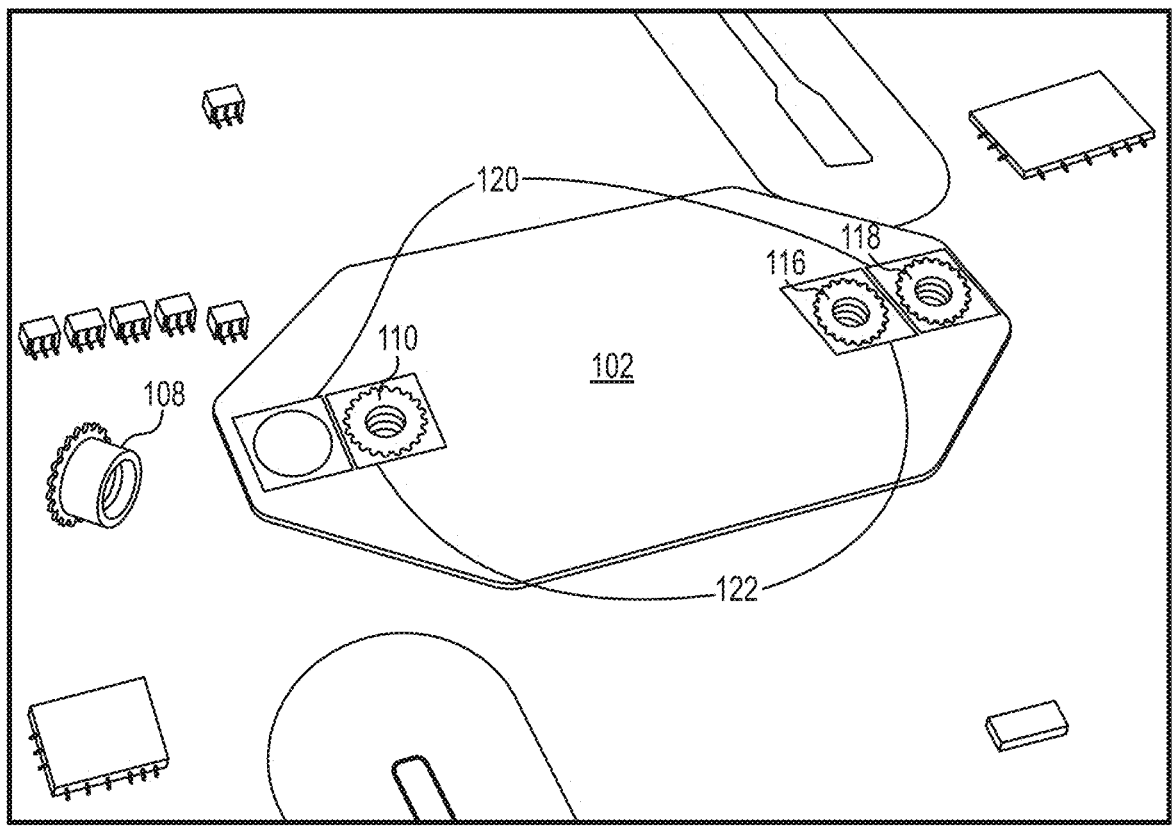
FIG. 1 illustrates an example of a mounting plate assembly, consistent with the present disclosure.
Figure 2:
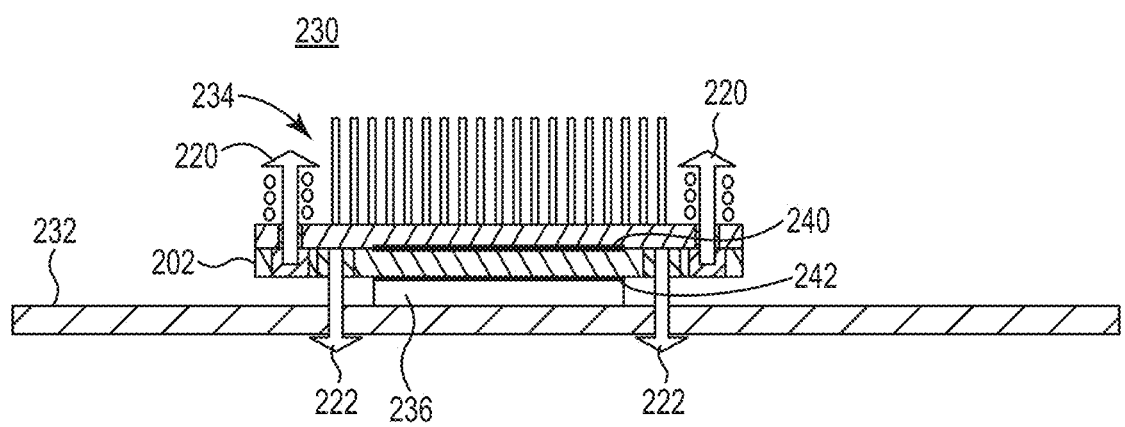
FIG. 2 illustrates a front view cross section of an example of a mounting plate system with an air-cooled heat sink, consistent with the present disclosure.
Figure 3:
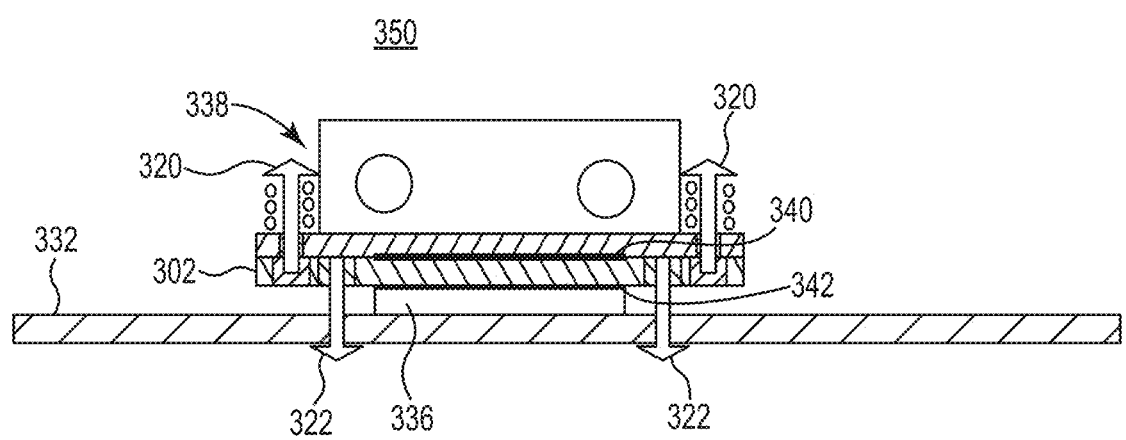
FIG. 3 illustrates a front view cross section of an example of a mounting plate system with a liquid-cooled heat sink, consistent with the present disclosure.

FIG. 1 illustrates an example of a heat transfer adapter plate 102, according to the present disclosure. As illustrated by FIG. 1, the heat transfer adapter plate 102 can accept a plurality of heat transfer device types, such as a passive heat exchanger (e.g., an air-cooled heat sink), an active heat exchanger (e.g., a liquid-cooled heat sink), and a heat pipe (e.g., a vapor chamber). Retention mechanisms can be used to couple various components to the heat transfer adapter plate 102, which can be, but is not limited to, a push pin, a spring clip, a screw, and/or a fixed nut. The heat transfer adapter plate 102 can comprise a first retention mechanism 120 to couple a heat transfer device (not shown in FIG. 1, but examples are shown in FIG. 2 and FIG. 3) to the heat transfer adapter plate 102. Coupling can be a physical connection between components. Coupling can also be a thermal connection between components such that heat can be transferred from one component to another component.

The heat transfer adapter plate 102 can comprise a second retention mechanism 122 to couple the heat transfer adapter plate 102 to an electronic component (not shown in FIG. 1, but examples are shown in FIGS. 2 and 3). The first retention mechanism 120 and the second retention mechanism 122 can be, but is not limited to, a push pin, a spring clip, and/or a screw. The electronic component can be a printed circuit board, a mainboard, and/or a server board. A heat generating element can be located on the electronic component. The heat generating element can be an element on an electronic component that during operation of the element generates heat.

The first retention mechanism 120 can comprise a first set of apertures and fixed nuts on the heat transfer adapter plate 102. As illustrated in FIG. 1, a first aperture 104 can receive a first fixed nut 108 and a second aperture can receive a second fixed nut 118. The first fixed nut 108 and the second fixed nut 118 can pass through the heat transfer adapter plate 102 to couple a heat transfer device to the heat transfer adapter plate 102.

The second retention mechanism 122 can comprises a second set of apertures and fixed nuts installed on the heat transfer adapter plate 102. A third aperture can receive a third fixed nut 110 and a fourth aperture can receive a fourth fixed nut 116. The third fixed nut 110 and the fourth fixed nut 116 can pass through the heat transfer adapter plate 102 to couple the heat transfer adapter plate 102 to an electronic component. A screw, not shown in FIG. 1, can be inserted in can inserted in each of the fixed nuts 108, 118, 116, and 110 such that the screw passes through the heat transfer adapter 102 and each of the fixed nuts 108, 118, 116, and 110. The screw and the fixed nuts 108, 118, 116, and 110 can comprise a thermal conductive material, such as copper, which can enhance the heat transfer.

As illustrated by FIG. 1, the apertures receiving the third fixed nut 110 and the fourth fixed nut 116 can be located in between the apertures receiving the first fixed nut 108 and the second fixed nut 118 such that the first fixed nut 108 and the second fixed nut 118 are received by an outer set of apertures and the third fixed nut 110 and the fourth fixed nut 116 are received by an inner set of apertures.

The heat adapter plate 102 is not limited to the configuration illustrated in FIG. 1. For example, the second retention mechanism 122, which includes the inner set of apertures, can couple the heat transfer device to the heat transfer adapter plate 102 and the first retention mechanism 120, which includes the outer set of apertures, can couple the couple the heat generating element on the electronic component to the heat transfer adapter plate 102. Additionally, the number of apertures in either the first retention mechanism 120 or the second retention mechanism 122 is not limited to two apertures. For example, the first retention mechanism 120 and the second retention mechanism 122 can each have three or four apertures.

The heat transfer adapter plate 102 can comprise a material that is a relatively good thermal conductor. Such a material can be, but is not limited to, aluminum, copper, and steel. The heat transfer adapter plate 102 can be a heat pipe. The shape and thickness of the heat transfer adapter plate 102 can be selected based on mechanical, thermal, and/or manufacturing needs.

The heat transfer adapter plate 102 can include a first surface to accept a heat transfer device and a second surface to accept a heat generating element on an electronic component. For example, the first surface can be opposite to the second surface such that the first surface is a top surface and the second surface is a bottom surface. In some examples, the heat generating element can be a processing unit or an application specific integrated circuit (ASIC).

The first surface of the heat transfer adapter plater 102 can interchangeably accept a passive heat exchanger, an active heat exchanger, and a heat pipe. For example, the first surface of the heat transfer adapter plater 102 can accept an air-cooled heat sink. The heat transfer adapter plater 102 can include a first set of screws to pass through the inner set of apertures and to couple the heat transfer device to the first surface and a second set of screws to pass through the outer set of apertures to couple the electronic component to the second surface.

As illustrated in FIG. 1, the heat transfer adapter plate 102 can provide an option of using a variety of heat transfer device types associated with different cooling systems. For example, the heat transfer adapter plate 102 can be initially coupled to with a heat transfer device type for a cooling system, such as an air cooling system, with an electronic component as illustrated in FIG. 2 and later the heat transfer adapter plate 102 can be coupled to a heat transfer device type for another cooling system, such as a liquid cooling system as illustrated in FIG. 3, without affecting the electronic component.

FIG. 2 illustrates a front view cross section of an example of a heat transfer adapter plate system 230 with an air-cooled heat sink 234, according to the present disclosure. As illustrated by FIG. 2, the heat transfer adapter plate system 230 can include a heat generating element 236 on an electronic component 232 and an air-cooled heat sink 234. The system 230 can include a heat transfer adapter plate 202. The heat transfer adapter plate 202 can be analogous to the heat transfer adapter plate 102 as referenced in FIG. 1 and the heat transfer adapter plater 302 as referenced in FIG. 3. Although FIG. 2 shows an air-cooled heat sink 234, the heat transfer adapter plate 202 can accept a variety of heat transfer device types including, but not limited to, a passive heat exchanger, an active heat exchanger, and a heat pipe. For example, the heat transfer adapter plate 202 can also accept a liquid-cooled heat sink 338 as illustrated in FIG. 3 and discussed below.

The heat transfer adapter plate 202 can comprise a first retention mechanism 220 to couple the air-cooled heat sink 234 to the heat transfer adapter plate 202. The heat transfer adapter plate 202 can comprise a second retention mechanism 222 to couple the heat transfer adapter plate 202 to a heat generating element 236 on an electronic component 232. The first retention mechanism 220 and the second retention mechanism 222 can be, but is not limited to, a push pin, a spring clip, and a screw. The electronic component 232 can be, but is not limited to, a printed circuit board, a mainboard, and a server board. The heat generating element 236 can be, but is not limited to, a processing unit and an application specific integrated circuit (ASIC).

A first thermal interface layer 240 can be located between the air-cooled heat sink 234 and the heat transfer adapter plate 202. The heat transfer adapter plate 202 can be coupled to the electronic component 232 such that the heat transfer adapter plate 202 is positioned in proximity to the heat generating element 236. In such a configuration, the heat generating element 236 can be in between the heat transfer adapter plate 202 and the electronic component 232. A second thermal interface layer 242 can be located between the air-cooled heat sink 234 and the heat transfer adapter plate 202. The first thermal interface layer 240 and the second thermal interface layer 242 can each comprise, but is not limited to, a thermal conducting elastomer and a thermal grease.

As illustrated in FIG. 2, the system 230 can provide an option of using a variety of heat transfer device types associated with different cooling systems. For example, the system 230 can be initially used with a heat transfer device type for a cooling system, such as an air cooling system, with an electronic component and later the system 230 can be used with a heat transfer device type for another cooling system, such as a liquid cooling system as illustrated in FIG. 3, without affecting the electronic component.

FIG. 3 illustrates a front view cross section of an example of a mounting plate system 350 with a liquid-cooled heat sink 338, according to the present disclosure. As illustrated by FIG. 3, the system 350 can include a heat generating element 336 on an electronic component 332 and a liquid-cooled heat sink 338. The liquid-cooled heat sink 338 can be a liquid-cooled cold plate heat sink. The system 350 can include a heat transfer adapter plate 302. The heat transfer adapter plate 302 can be analogous to the heat transfer adapter plater 102 as referenced in FIG. 1 the heat transfer adapter plater 202 as referenced in FIG. 2. The heat transfer adapter plate 302 can accept the liquid-cooled heat sink 338. Although FIG. 3 shows a liquid-cooled heat sink 338, the heat transfer adapter plate 302 can accept a variety of heat transfer device types including, but not limited to, a passive heat exchanger, an active heat exchanger and a heat pipe. For example, the heat transfer adapter plate 302 can also accept an air-cooled heat sink 234 as illustrated in FIG. 2 and discussed above.

The heat transfer adapter plate 302 can comprise a first retention mechanism 320 to couple the liquid-cooled heat sink 338 to the heat transfer adapter plate 302. The heat transfer adapter plate 302 can comprise a second retention mechanism 322 to couple the heat transfer adapter plate 302 to a heat generating element 336 on an electronic component 332. The first retention mechanism 320 and the second retention mechanism 322 can be, but is not limited to, a push pin, a spring clip, and a screw. The electronic component 332 can be, but is not limited to, a printed circuit board, a mainboard, and a server board. The heat generating element 336 can be, but is not limited to, a processing unit and an application specific integrated circuit (ASIC).

A first thermal interface layer 340 can be located between the liquid-cooled heat sink 338 and the heat transfer adapter plate 302. The heat transfer adapter plate 302 can be coupled to the electronic component 332 such that the heat transfer adapter plate 302 is positioned in proximity to the heat generating element 336. In such a configuration, the heat generating element 336 can be in between the heat transfer adapter plate 302 and the electronic component 332. A second thermal interface layer 342 can be located between the air-cooled heat sink 334 and the heat transfer adapter plate 302. The first thermal interface layer 340 and the second thermal interface layer 342 can each comprise, but is not limited to, a thermal conducting elastomer and a thermal grease.

In the foregoing detailed description of the present disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

The figures herein follow a numbering convention in which the first digit corresponds to the drawing figure number and the remaining digits identify an element or component in the drawing. Elements shown in the various figures herein can be added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense. Further, as used herein, "a number of" an element and/or feature can refer to one or more of such elements and/or features.

What is claimed is:

1. A heat transfer adapter plate, comprising:
   a first surface on a first side to accept a heat transfer device;
   a second surface on a second side, opposite the first side, to accept a heat generating element on an electronic component;
   a first retention mechanism to couple the heat transfer device to the heat transfer adapter plate, the heat transfer adapter plate to accept the first retention mechanism from the first side, wherein the first retention mechanism comprises:
      a first set of apertures on the heat transfer adapter plate, and
      a first set of screws to pass through the first set of apertures from the first side of the heat transfer adapter plate;
   a second retention mechanism to couple the heat transfer adapter plate to the electronic component, the heat transfer adapter plate to accept the second retention mechanism from the second side; and
   a second set of apertures located in between the first set of apertures.

2. The heat transfer adapter plate of claim 1, wherein the heat transfer adapter plate is to accept a plurality of heat transfer device types.

3. The heat transfer adapter plate of claim 1, further comprising fixed nuts in the first set of apertures to accept the first set of screws.

4. The heat transfer adapter plate of claim 1, wherein the first retention mechanism is at least one of: a push pin, a spring clip, and a screw.

5. The heat transfer adapter plate of claim 1, wherein the heat transfer adapter plate comprises at least one of: aluminum, copper, steel, and a heat pipe.

6. The heat transfer adapter plate of claim 1, further comprising a second set of screws to pass through the second set of apertures from the second side of the heat transfer adapter plate.

7. A heat transfer adapter plate system comprising:
   a heat transfer device;
   a heat generating element on an electronic component;
   a heat transfer adapter plate including:
      a first surface on a first side to accept the heat transfer device;
      a second surface on a second side, opposite the first side, to accept the heat generating element on the electronic component;
      a first retention mechanism to couple the heat transfer device to the heat transfer adapter plate, the heat transfer adapter plate to accept the first retention mechanism from the first side; and
      a second retention mechanism to couple the heat transfer adapter plate to the heat generating element and the electronic component, the heat transfer adapter plate to accept the second retention mechanism from the second side;
   a first thermal interface layer located between the heat transfer device and the heat transfer adapter plate; and
   a second thermal interface layer between the heat transfer plate and the heat generating element.

8. The system of claim 7, wherein the heat transfer device comprises at least one of: a passive heat exchanger, an active heat exchanger, and a heat pipe.

9. The system of claim 7, wherein the first thermal interface layer comprises at least one of: a thermal conducting elastomer and a thermal grease.

10. The system of claim 7, wherein the heat transfer adapter plate includes:
   an outer set of apertures to accept the first retention mechanism from the first side; and
   an inner set of apertures to accept the second retention mechanism from the second side.

* * * * *